United States Patent [19]

Hirata

[11] Patent Number: 4,482,869

[45] Date of Patent: Nov. 13, 1984

[54] PLL DETECTION CIRCUIT HAVING DUAL BANDWIDTH LOOP FILTER

[75] Inventor: Hitoshi Hirata, Tokyo, Japan

[73] Assignee: Pioneer Electronic Corporation, Tokyo, Japan

[21] Appl. No.: 368,067

[22] Filed: Apr. 13, 1982

[51] Int. Cl.³ .............................................. H03L 7/10
[52] U.S. Cl. .......................................... 331/4; 331/17; 331/25; 331/DIG. 2; 329/122
[58] Field of Search .......... 331/8, 17, 23, 25, DIG. 2, 331/4; 329/50, 122

[56] References Cited

U.S. PATENT DOCUMENTS 4,077,015 2/1978 Carson et al. ............................ 331/4

*Primary Examiner*—Siegfried H. Grimm
*Assistant Examiner*—D. C. Mis

*Attorney, Agent, or Firm*—Sughrue, Mion, Zinn, Macpeak & Seas

[57] ABSTRACT

A PLL detection circuit for use in an AM-PM type AM stereo receiver in which unwanted AC signal components included in the output of a phase comparator are suppressed by switching the frequency response characteristic of a loop filter in the PLL detection circuit as locking is reached so that only the DC signal component, corresponding to the phase difference of the input signal and a reference signal, is outputted. A changeover circuit, including a switching circuit composed of a pair of parallel-connected transistors, is connected in parallel with an element of the loop filter, the component value of which affects or is at least partially determinative of the frequency response characteristic of the loop filter. The changeover circuit is activated by a control signal indicative of the locking state of the PLL detection circuit.

5 Claims, 3 Drawing Figures

PLL DETECTION CIRCUIT HAVING DUAL BANDWIDTH LOOP FILTER

BACKGROUND OF THE INVENTION

The present invention relates to a PLL (phase-locked loop) detection circuit.

A PLL detection circuit is used to detect the sub-signal, which is the difference signal between the right and left channel signals, in an AM-PM type AM stereo receiver.

For such a PLL detection circuit, it is necessary that unwanted AC signal components included in the output of the phase comparator be sufficiently suppressed by making the frequency response characteristic of a so-called "loop-filter" used in the circuit narrow so that only the DC signal component corresponding to the phase difference of the input signal, i.e., the phase-modulated signal is outputted. To accomplish this, the loop filter must employ a large time constant.

However, if the response characteristic is made narrow by increasing the time constant of the loop filter, then the lock-in time which elapses from the instant that the PLL detection circuit is placed in the unlocked state until it again achieves the locked state is increased, as a result of which the PLL detection circuit does not operate at the desired point. If automatic sweep is employed, sometimes locking cannot be obtained. Therefore, it is necessary to suitably change the frequency characteristic of the loop filter.

Accordingly, an object of the invention is to provide a PLL detection circuit in which the frequency response characteristic of the loop filter can be smoothly switched, and in which the amount of induced distortion due to the switching is small.

SUMMARY OF THE INVENTION

In a PLL detection circuit according to the invention, a transistor switching circuit including a pair of parallel-connected transistors is connected in parallel with at least one element of the loop filter. The frequency response characteristic of the loop filter is changed by activating the pair of transistors in response to a predetermined control signal.

More specifically, a PLL detection circuit of the invention includes a loop filter and a changeover circuit for switching the frequency response characteristics of the loop filter. The switching circuit is implemented as a pair of parallel-connected transistors with the switching circuit being parallel connected to at least one element of the loop filter, the component value of which is determinative of the frequency characteristic of the loop filter. The pair of transistors are activated in response to a predetermined control signal, specifically, a signal indicative of the locked state of the PLL circuit.

DESCRIPTION OF THE PREFERRED EMBODIMENTS

A preferred embodiment of the invention will be described with reference to the accompanying drawings.

Figure 1:
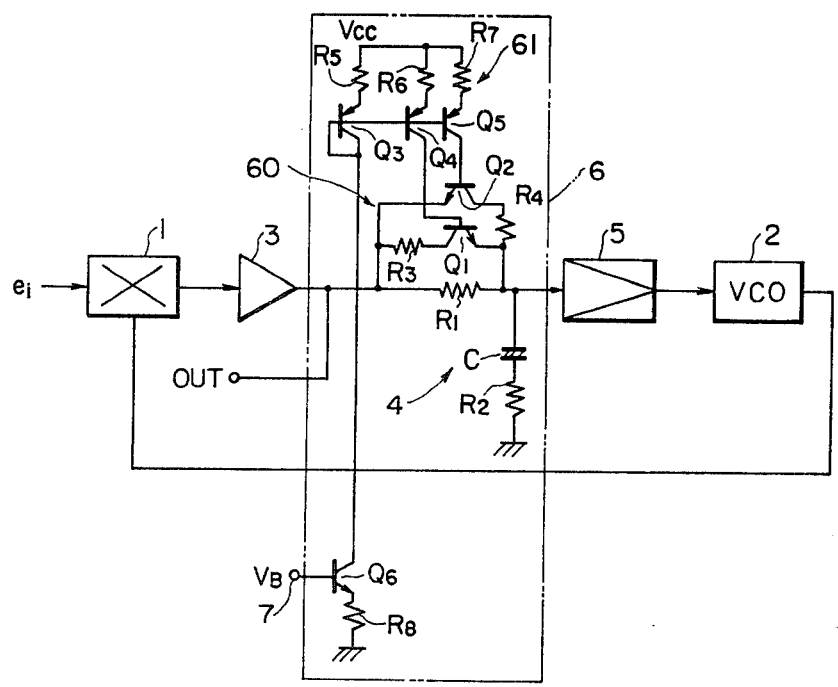
FIG. 1 is a circuit diagram showing a preferred embodiment of a PLL detection circuit of the invention.

FIG. 1 is a circuit diagram of a PLL detection circuit of the invention. In FIG. 1, a phase comparator 1 receives a predetermined signal $e_i$ as an input to be compared and the oscillator output of a VCO (voltage-controlled oscillator) 2 as a phase reference input. The phase comparator 1 provides an output signal having a magnitude determined according to the frequencies of and the phase difference between the oscillator output and the input signal $e_i$. The output of the phase comparator 1 is provided as a detection output through a buffer 3. The unwanted AC signal components of the output are suppressed by a loop filter 4 composed of resistors $R_1$ and $R_2$ and a capacitor C; that is, the loop filter 4 outputs only the DC signal component of the output of the phase comparator. This DC component, which is supplied to the VCO 2 through a DC amplifier 5, is used to control the frequency and phase of the VCO 2.

A changeover circuit 6 operates to switch the frequency response characteristic of the loop filter 4 in response to a control signal $V_B$ which is supplied to a terminal 7. The changeover circuit 6 includes a transistor switching circuit 60 which includes a pair of transistors $Q_1$ and $Q_2$. The transistors $Q_1$ and $Q_2$ are parallel connected and are of the same conductivity type, with the collectors of transistors $Q_1$, $Q_2$ being respectively connected to the emitters of transistors $Q_2$, $Q_1$, via resistors $R_3$, $R_4$ the parallel connection is achieved through current limiting resistors $R_3$ and $R_4$ connected to the collectors of the two transistors. The transistor switching circuit 60 is connected in parallel to at least one element of the filter 4, the component value of which is determinative of the frequency response characteristic of the loop filter 4, for instance to the resistor $R_1$. The pair of transistors $Q_1$ and $Q_2$ in the switching circuit 60 are activated by a current mirror circuit 61 which receives the aforementioned control signal $V_B$.

The current mirror circuit 61 is implemented with a two-stage arrangement including a diode-connected transistor $Q_3$, transistors $Q_4$ and $Q_5$ having their bases connected to the base of the transistor $Q_3$ and their collectors connected to the respective bases of the transistors $Q_1$ and $Q_2$, and a transistor $Q_6$ the collector of which is connected to the collector of the transistor $Q_3$. The control signal $V_B$ is applied to the base of the transistor $Q_6$. The emitters of the transistors $Q_3$, $Q_4$ and $Q_5$ are connected to a power source $V_{cc}$ through resistors $R_5$, $R_6$ and $R_7$, respectively. The emitter of the transistor $Q_6$ is grounded through a resistor $R_8$.

A lock detection signal may be employed as the control signal $V_B$. This signal is in an active state when an in-phase detector detects the locked state of the PLL detection circuit. Alternatively for the control signal $V_B$, a switching signal may be employed which is in an active state when a zero volt switch including a window comparator detects (according to the "S" curve of the PLL detection circuit) that the vicinity of the tuning frequency has been reached.

Figure 2A:
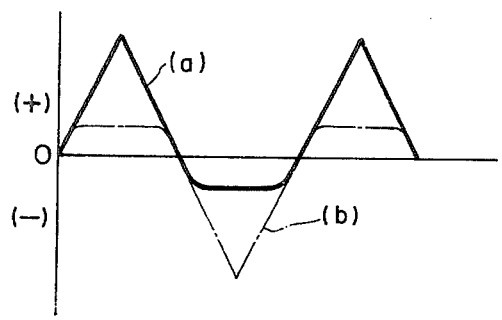
FIGS. 2A and 2B are waveform diagrams used for a description of the operation of the switching circuit of FIG. 1.
Figure 2B:
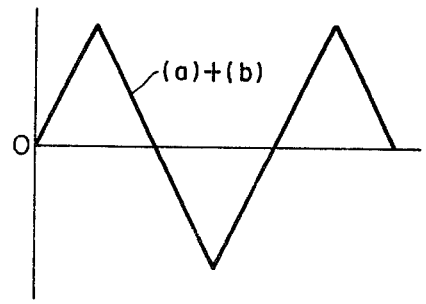

When the frequency of the input signal $e_i$ is at the tuning frequency or in a predetermined band near the tuning frequency, the control signal $V_B$ is raised to a high level. Accordingly, the current mirror circuit 61 is placed in the "on" state, thereby activating the transistors $Q_1$ and $Q_2$ in the switching circuit 60. In the switching circuit 60, the following phenomena occur. As shown in FIG. 2A, for a positive voltage swing, a current flows in the transistor $Q_1$, but for a negative voltage swing, the current is clipped because the collector-emitter of the transistor $Q_1$ is reverse biased (waveform a). On the other hand, the operation of the transistor $Q_2$ is completely opposite to that of the transistor $Q_1$ (as indicated by the waveform b). By combining the currents of the two transistors $Q_1$ and $Q_2$, a composite current having low distortion is obtained as shown in FIG. 2B. The frequency response characteristic of the PLL detection circuit is wide because $R \cdot R_1/(R+R_1)$ serves as series resistance (where $R=R_3=R_4$).

When the input signal $e_i$ comes within the locking range of the PLL detection as the signal frequency of the input signal $e_i$ is slowly swept, the input signal is readily locked because the frequency response characteristic of the PLL circuit is wide. When the frequency of the input signal $e_i$ reaches the tuning frequency or comes within a frequency band near the tuning frequency, the control signal $V_B$ changes to a low level. Therefore, the current mirror circuit 61 is then placed in the "off" state making the transistors $Q_1$ and $Q_2$ inactive. Accordingly, the time constant of the loop filter 4 is increased to a large value defined by the resistors $R_1$ and $R_2$ and the capacitor C, as a result of which the frequency response characteristic of the PLL detection circuit becomes narrow. Accordingly, the unwanted AC signal components included in the output of the phase comparator 1 are sufficiently suppressed, and only the DC signal component corresponding to the phase difference is outputted. Thus, phase detection is accurately and quickly obtained.

As is apparent from the above description, according to the invention, a switching circuit including a pair of parallel-connected transistors is employed. With this arrangement, the frequency response characteristic of the loop filter can be smoothly switched, and the amount of induced distortion due to switching is small. As a pair of transistors are rendered active merely by applying externally-generated base currents, very little offset voltage is developed. The employment of the current mirror circuit is advantageous for purposes of producing the PLL detection circuit in the form of an integrated circuit. In producing the PLL detection circuit in the form of a one-chip monolithic integrated circuit, the circuit can be manufactured without the need for external circuit components. This is another merit of the invention.

I claim:

1. A PLL (phase locked loop) detection circuit, comprising: a loop filter comprising plural elements; a changeover circuit for switching a frequency response characteristic of said loop filter, and changeover circuit comprising a switching circuit including a pair of parallel-connected transistors, said switching circuit being connected across respective end terminals of a circuit which includes at least one of said plural loop filter elements; and actuating means for switching said pair of transistors in response to a predetermined control signal, said actuating means comprising a current mirror circuit having a two-stage configuration, outputs of said current mirror circuit stages being respectively connected to bases of said pair of transistors.

2. The PLL detection circuit as claimed in claim 1, wherein said at least one of said loop filter elements comprises a resistor.

3. The PLL detection circuit as claimed in claim 1, wherein said predetermined control signal comprises a lock detection signal having an actuated state corresponding to a locked state of said PLL detection circuit.

4. A PLL (phase locked loop) detection circuit comprising: a phase comparator receiving an input signal on a comparison input thereof; a buffer amplifier having an input coupled to an input coupled to an output of said buffer amplifier, said loop filter comprising at least one element a component value of which affects a frequency response characteristic of said loop filter; a DC amplifier having an input coupled to an output of said loop filter; a voltage-controlled oscillator having an input coupled to an output of said DC amplifier and an output coupled to a reference input of said phase comparator; a changeover circuit for switching said frequency response characteristic of said loop filter, said changeover circuit comprising a first transistor receiving on a control input thereof a predetermined control signal having a state indicative of a locked state of said PLL detection circuit, a current mirror circuit comprising a diode-connected second transistor having a collector and base coupled to a collector of said first transistor and third and fourth transistors having bases coupled to said base of said second transistor, emitters of said second, third and fourth transistors being coupled through respective resistors to a voltage source, and fifth and sixth transistors having bases connected to collectors of said third and fourth transistors, respectively, an emitter of said fifth transistor being coupled to a first terminal of said element of said loop filter, a collector of said fifth transistor being coupled through a resistor to a second terminal of said element of said loop filter, a collector of said sixth transistor being coupled through a resistor to said first terminal of said element and an emitter of said sixth transistor being coupled to said second terminal of said element.

5. The PLL detection circuit as claimed in claim 4, wherein said loop filter comprises an RC loop filter and said element of said loop filter is a resistor.

* * * * *